US008346201B2

(12) United States Patent  
Chen

(10) Patent No.: US 8,346,201 B2  
(45) Date of Patent: Jan. 1, 2013

(54) ASYNCHRONOUS FIRST IN FIRST OUT INTERFACE, METHOD THEREOF AND INTEGRATED RECEIVER

(75) Inventor: Tse-Peng Chen, Taipei (TW)

(73) Assignee: Richwave Technology Corp., Taipei (TW)

( * ) Notice: Subject to any disclaimer, the term of this patent is extended or adjusted under 35 U.S.C. 154(b) by 448 days.

(21) Appl. No.: 12/763,281

(22) Filed: Apr. 20, 2010

(65) Prior Publication Data

US 2011/0070854 A1 Mar. 24, 2011

(30) Foreign Application Priority Data

Sep. 24, 2009 (TW) ................................ 98132282 A

(51) Int. Cl.
*H04B 1/16* (2006.01)
(52) U.S. Cl. ........................................ 455/318; 455/323
(58) Field of Classification Search .................. 455/208, 455/209, 216, 313, 318, 323; 370/315, 350, 370/352, 354, 412, 465
See application file for complete search history.

(56) References Cited

U.S. PATENT DOCUMENTS

| 5,497,405 | A | * | 3/1996 | Elliott et al. | 375/372 |
| 6,687,255 | B1 | * | 2/2004 | Holm et al. | 370/412 |
| 7,876,720 | B2 | * | 1/2011 | Huertgen et al. | 370/315 |
| 7,996,704 | B2 | * | 8/2011 | Chen | 713/600 |
| 8,126,390 | B2 | * | 2/2012 | Oga | 455/1 |

* cited by examiner

*Primary Examiner* — Blane J Jackson
(74) *Attorney, Agent, or Firm* — Wang Law Firm, Inc.; Li K. Wang; Stephen Hsu

(57) ABSTRACT

An asynchronous FIFO interface having a readout clock asynchronous with a write clock is provided. The asynchronous FIFO interface includes a FIFO buffer, a clock controller, a reference source and a signal source. The FIFO buffer receives a digital signal from an ADC according to the write clock and outputs a digital signal to a processor according to the readout clock. The clock controller outputs a clock control signal according to the amount of data stored in the FIFO buffer. The reference source provides an oscillation frequency. The signal source divides the oscillation frequency by a first integer divisor to generate a reference frequency, divides the readout clock by a second integer divisor to generate an input frequency, and outputs a control signal by comparing the reference frequency with the input frequency.

45 Claims, 11 Drawing Sheets

ASYNCHRONOUS FIRST IN FIRST OUT INTERFACE, METHOD THEREOF AND INTEGRATED RECEIVER

CROSS REFERENCE TO RELATED APPLICATIONS

This Application claims priority of Taiwan Patent Application No. 098132282, filed on Sep. 24, 2009, the entirety of which is incorporated by reference herein.

BACKGROUND OF THE INVENTION

1. Field of the Invention

The invention relates to an asynchronous first in first out (FIFO) interface, and in particular, to an asynchronous FIFO interface in a radio frequency (RF) device.

2. Description of the Related Art

Demand for low cost, low power consumption and smaller radio frequency (RF) receivers of communication systems have increased because the popularity of wireless communications (e.g. cell phones, wireless networks). Additionally, a multitude of devices, such as analog transceivers, digital processors and clock generators have been developed and integrated into a single chip for multifunction ability. For an RF transceiver, analog circuits and digital circuits have different clock requirements. For example, in an analog circuit, a low-jitter clock is required for the analog-to-digital converters (ADCs) and digital-to-analog converters (DACs) to increase the accuracy of data conversion. However, in a digital circuit, the low-jitter clock is not necessary.

In light of the above, the clock of the ADC is separated from the clock of the base band processor in the conventional circuit, as shown in FIG. 1. FIG. 1 is a block diagram of a receiver 100 using an asynchronous FIFO interface. The receiver 100 comprises an RF front-end receiver 110, an ADC 112, a first signal source 114, a FIFO buffer 121, a clock controller 122, a variable integer divider 124, a baseband processor 130, a second signal source 132 and a reference source 140.

The RF front-end receiver 110 receives an RF signal transmitted from a transmitter (not shown in FIG. 1), and converts the RF signal into an intermediate frequency (IF) signal according to an oscillation signal generated by the first signal source 114. The local signal is generated by the first signal source 114 with low-jitter clock to increase the signal-to-noise ratio (SNR) and decrease the blocking effect of the neighboring channels when frequency conversion is performed. The ADC 112 converts the low-IR signal into data (i.e., a digital signal) and outputs the data according to a clock with a variable frequency to avoid the additional use of a low-jitter signal source and meet the demands of the low-jitter clock. The clock with the variable frequency is generated by the variable integer divider 124 according to the local signal from the first signal source 114. The baseband processor 130 performs signal processing of the data, such as transmission mode detection, time-domain data processing, frequency-domain data processing and channel code, according to another oscillation signal generated from the second signal source 132. The second signal source 132 is a fixed-frequency and high jitter signal source, such as ring oscillator which is used to save on hardware costs. The baseband processor 130 operates following the second signal from the second signal source 132. The reference source 140 can be shared by the first signal source 114 and the second signal source 132 to further save on the hardware costs.

The clock (i.e., the second signal) provided from the second signal source 132 to the baseband processor 130 can be asynchronous with the clock provided from each signal source to the ADC 112. Thus, the conventional circuit uses an FIFO interface 120 when processing the asynchronous data transmission between the ADC 112 and the baseband processor 130. The asynchronous FIFO interface 120 comprises a FIFO buffer 121, a clock controller 122 and a variable integer divider 124. The FIFO buffer 121 is coupled between the baseband processor 130 and the ADC 112 to buffer the data transmission between the baseband processor 130 and the ADC 112. The FIFO buffer 121 receives the data from the ADC 112 according to a write clock and outputs the data to the baseband processor 130 according to a readout clock. In this case, the write clock is the clock that operates the ADC 112 (i.e., the clock with the variable frequency from the variable integer divider 124), and the readout clock is the clock that operates the baseband processor 130 (i.e., the second signal from the second signal source 132). When the write clock, operating the ADC 112, is faster than the readout clock, operating the baseband processor 130, the FIFO buffer 121 is in a data-overflow status. Thus, the clock controller 122 increases the divisor of the variable integer divider 124 to decrease frequency of the write clock (i.e., slow down the write clock). On the contrary, when the write clock, operating the ADC 112, is slower than the readout clock, operating the baseband processor 130, the FIFO buffer 121 is in a data-empty status. Thus, the clock controller 122 decreases the divisor of the variable integer divider 124 to increase frequency of the write clock (i.e., speed up the write clock).

In the conventional circuit shown in FIG. 1, the divisor of the variable integer divider 124 is adjusted by the clock controller 122 to control the write clock of the ADC 112 and the data status of the FIFO buffer 112. However, the control of the data status of the FIFO buffer 121 may not need to be adjusted by the variable integer divider 124.

BRIEF SUMMARY OF THE INVENTION

The invention provides an asynchronous FIFO interface having a readout clock asynchronous with a write clock, comprising a buffer, a clock controller, a reference source and a signal source. The buffer receives a digital signal from an analog-to-digital converter (ADC) according to the write clock and outputs a digital signal to a processor according to the readout clock. The clock controller outputs a clock control signal according to the amount of data stored in the buffer. The reference source provides an oscillation frequency. The signal source divides the oscillation frequency by a first integer divisor to generate a reference frequency, divides the readout clock by a second integer divisor to generate an input frequency, and outputs a control signal by comparing the reference frequency with the input frequency to adjust the readout clock that was output, wherein the second integer divisor is determined by the clock control signal.

The invention also provides an interface operation method for operating an asynchronous interface having a readout clock and a write clock, wherein the asynchronous interface comprises a buffer. The interface operation method comprises: receiving a digital signal from an analog-to-digital converter (ADC) according to the write clock; outputting a digital signal from the buffer to a processor according to the readout clock; outputting a clock control signal according to the amount of data stored in the buffer; providing an oscillation frequency; dividing the oscillation frequency by a first integer divisor to generate a reference frequency; dividing the readout clock by a second integer divisor to generate an input frequency; and adjusting the readout clock by comparing the reference frequency with the input frequency, wherein the second integer divisor is determined by the clock control signal.

The invention also provides an asynchronous FIFO interface having a readout clock asynchronous with a write clock, comprising: a buffer, a clock controller, a reference source and a signal source. The buffer receives a digital signal from an analog-to-digital converter (ADC) according to a write clock and outputs a digital signal to a processor according to a readout clock. The clock controller outputs first control bits according to the amount of data stored in the buffer. The reference source provides an oscillation frequency. The signal source divides the oscillation frequency by a first integer divisor to generate a reference frequency, divides the readout clock by a second integer divisor to generate an input frequency, outputs second control bits by comparing the reference frequency with the input frequency, sums up the first control bits and the second control bits to obtain a total of the first and second control bits (total control bits), and adjusts the readout clock that was output according to the total control bits.

The invention also provides an interface operation method for operating an asynchronous interface having a readout clock and a write clock, wherein the asynchronous interface comprises a buffer. The interface operation method comprises: receiving a digital signal from an analog-to-digital converter (ADC) according to the write clock; outputting a digital signal from the buffer to a processor according to the readout clock; outputting first control bits according to the amount of data stored in the buffer; providing an oscillation frequency; dividing the oscillation frequency by a first integer divisor to generate a reference frequency; dividing the readout clock by a second integer divisor to generate an input frequency; outputting second control bits by comparing the reference frequency with the input frequency; summing up the first control bits and the second control bits to obtain a total of the first and second control bits (total control bits); and adjusting the readout clock that was output according to the total control bits.

The invention also provides an integrated receiver, comprising: a frequency synthesizer, a clock system, an analog receiving path circuitry, a low-IF conversion circuitry, a processor and an asynchronous FIFO interface. The frequency synthesizer generates an output signal. The clock system generates a mixed signal and a write clock according to the output signal. The analog receiving path circuitry generates a low-IF signal according to the mixed signal. The low-IF conversion circuitry converts the low-IF signal to a first digital signal according to the write clock. The processor processes a second digital signal according to a readout signal. The asynchronous FIFO interface is coupled between the analog receiving path circuitry and the processor, and has the readout clock asynchronous with the write clock, wherein the asynchronous FIFO interface comprises: a buffer, a clock controller, a reference source and a signal source. The buffer receives the first digital signal from the low-IF conversion circuitry according to the write clock and outputs the second digital signal to the processor according to the readout clock. The clock controller outputs a clock control signal according to the amount of data stored in the buffer. The reference source provides an oscillation frequency. The signal source divides the oscillation frequency by a first integer divisor to generate a reference frequency, divides the readout clock by a second integer divisor to generate an input frequency, and outputs a control signal by comparing the reference frequency with the input frequency to adjust the readout clock that was output, wherein the second divisor is determined by the clock control signal.

The invention also provides an integrated receiver, comprising: a frequency synthesizer, a clock system, an analog receiving path circuitry, a low-IF conversion circuitry, a low-IF conversion circuitry, a processor and an asynchronous FIFO interface. The frequency synthesizer generates an output signal. The clock system generates a mixed signal and a write clock according to the output signal. The analog receiving path circuitry generates a low-IF signal according to the mixed signal. The low-IF conversion circuitry converts the low-IF signal to a first digital signal according to the write clock. The processor processes a second digital signal according to a readout signal. The asynchronous FIFO interface is coupled between the analog receiving path circuitry and the processor, and has the readout clock asynchronous with the write clock, wherein the asynchronous FIFO interface comprises: a buffer, a clock controller, a reference source and a signal source. The buffer receives a digital signal from an analog-to-digital converter (ADC) according to the write clock and outputs a digital signal to a processor according to the readout clock. The clock controller outputs first control bits according to the amount of data stored in the buffer. The reference source provides an oscillation frequency. The signal source divides the oscillation frequency by a first integer divisor to generate a reference frequency, divides the readout clock by a second integer divisor to generate an input frequency, outputs second control bits by comparing the reference frequency with the input frequency, and sums up the first control bits and the second control bits to obtain a total of the first and second control bits (total control bits), wherein the total control bits is determined by the readout clock.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
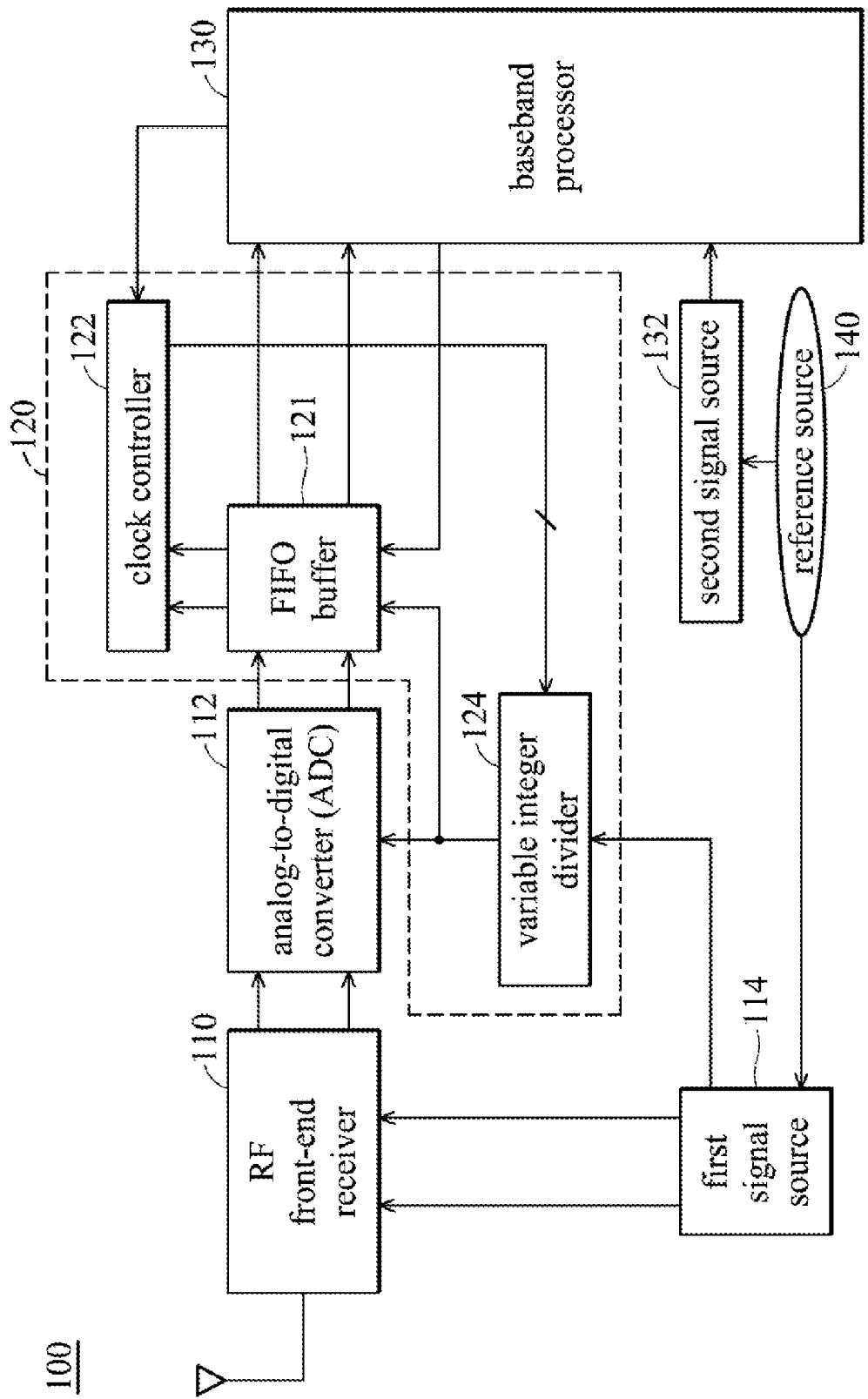
FIG. 1 is a block diagram of a receiver using an asynchronous FIFO interface.
Figure 2:
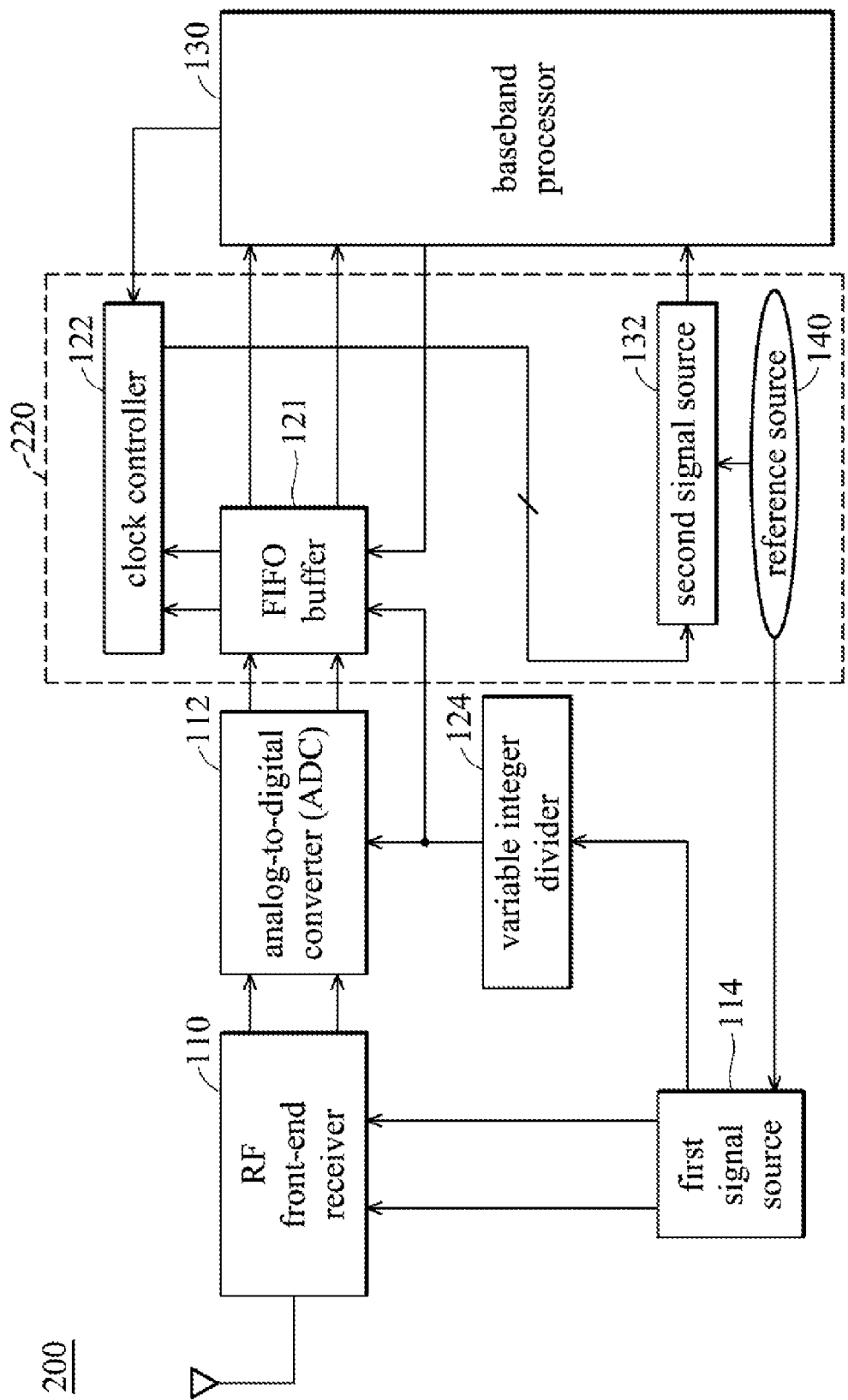
FIG. 2 is a block diagram of a receiver using an asynchronous FIFO interface according to an embodiment of the invention.

FIG. 2 is a block diagram of a receiver 200 using an asynchronous FIFO interface according to an embodiment of the invention. The receiver 200 comprises a radio frequency (RF) front-end receiver 110, an analog-to-digital converter (ADC) 112, a first signal source 114, a FIFO buffer 121, a clock controller 122, a variable integer divider 124, a baseband processor 130, a second signal source 132, and a reference source 140. In the embodiment, processing of the asynchronous data transmission between the ADC 112 and the baseband processor 130 by using an asynchronous FIFO interface 121, is the same as that of the conventional receiver 100 of FIG. 1. However, the difference between the embodiment and the conventional receiver 100 is that the asynchronous FIFO interface 220 comprises the FIFO buffer 121, the clock controller 122, the second signal source 132 and the reference source 140. The FIFO buffer 121 is coupled between the baseband processor 130 and the ADC 112 to buffer the data transmission between the baseband processor 130 and the ADC 112. The FIFO buffer 121 receives data (i.e., a digital signal) from the ADC 112 according to a write clock and outputs the data (i.e., the digital signal) to the baseband processor 130 according to a readout clock. The write clock operates the ADC 112 and the readout clock operates the baseband processor 130. When the readout clock, operating the baseband processor 130, is slower than the write clock, operating the ADC112, the FIFO buffer 121 is at a data-overflow status. Hence, the clock controller 122 increases the frequency of the second signal from the second signal source 132 to speed up the readout clock. On the contrary, when the readout clock, operating the baseband processor 130, is faster than the write clock, operating the ADC112, the FIFO buffer 121 is at a data-empty status. Hence, the clock controller 122 decreases the frequency of the second signal from the second signal source 132 to slow down the readout clock. By controlling the second signal (i.e., the readout clock) of the second signal source 132, frequency balance between the write clock of the ADC 112 and the second signal (i.e., the readout clock) of the second signal source 132 can be maintained such that the FIFO buffer 121 is not at a data-overflow or data-empty status The above is a summary of the invention, and detailed descriptions of the embodiments are as below.

Figure 3A:
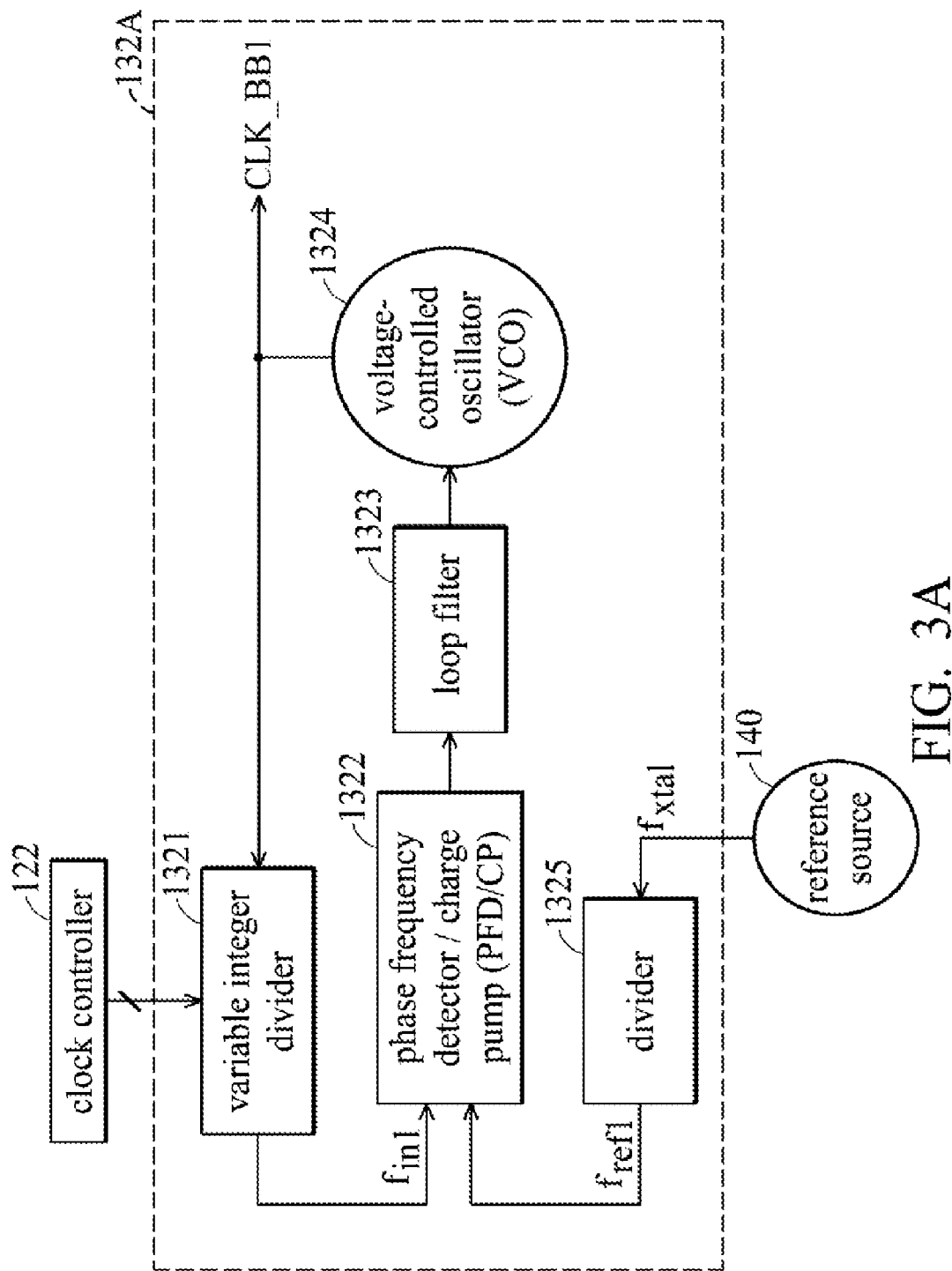
FIG. 3A is a block diagram of a second signal source according to an embodiment of the invention.

FIG. 3A is a block diagram of the second signal source according to an embodiment of the invention. The second signal source 132A may be a frequency synthesizer, comprising a variable integer divider 1321, a phase frequency detector/charge pump (PFD/CP) 1322, a loop filter 1323, a voltage-controlled oscillator (VCO) 1324 and a divider 1325. In FIG. 3A, a clock frequency CLK_BB1 is provided to baseband processor 130. The FIFO buffer 121 outputs the data (i.e., the digital signal) to the baseband processor 130 according to the clock frequency CLK_BB1. The clock frequency CLK_BB1 can be adjusted when the data status of the FIFO buffer 121 is not balanced (e.g. data-overflow or data-empty status). In FIG. 3A, the variable integer divider 1321 is capable of dividing the clock frequency CLK_BB1 of the baseband processor 130 by an integer divisor M, wherein M is determined by the clock controller 122. After dividing the clock frequency CLK_BB1 of the baseband processor 130 by an integer divisor M, the variable integer divider 1321 outputs the divided clock frequency (CLK_BB1/M) to the PFD/CP 1322 and serve as an input frequency $f_{in1}$ of the PFD/CP 1322. On the other hand, a divider 1325 receives an oscillation frequency $f_{xtal}$ of the reference source 140 and divides the oscillation frequency $f_{xtal}$ by an integer divisor N to generate a reference frequency $f_{ref1}$. The oscillation frequency $f_{xtal}$ of the reference source 140 is provided by a crystal. The PFD/CP 1322 receives and compares the input frequency $f_{in1}$, and the reference frequency $f_{ref1}$ and then outputs a result of the comparison to the loop filter 1323. The loop filter 1323 transmits a control signal to the VCO 1324 so that the VCO 1324 may adjust the output clock frequency CLK_BB1. When the clock frequency CLK_BB1 is stable, it is (M/N) times the value of the oscillation frequency $f_{xtal}$ of the reference source 140. The clock controller 122 adjusts the integer divisor M of the variable integer divider 1321 to further adjust the clock frequency CLK_BB1 output from the VCO 1324 to the baseband processor 130. For example, when the amount of data stored in the FIFO buffer 121 is greater than an upper-limit, the amount of data stored in the FIFO buffer 121 may reach the data-overflow status. Hence, the clock controller 122 adjusts the integer divisor M of the variable integer divider 1321 to increase the clock frequency CLK_BB1. Thus, the FIFO buffer 121 outputs data to the baseband processor 130 according to the speed of the increased clock frequency CLK_BB1 such that the baseband processor 130 has an increased readout speed to read out data from the FIFO buffer 121. Note that the speed of the increased clock frequency CLK_BB1 may be higher than that of the write speed of the ADC 112 to write in data to the FIFO buffer 121 such that the data-overflowing status can be solved in this way. Similarly, when the amount of data stored in the FIFO buffer 121 is less than a lower-limit, the amount of data stored in the FIFO buffer 121 may reach the data-empty status. Hence, the clock controller 122 adjusts the integer divisor M of the variable integer divider 1321 to decrease the clock frequency CLK_BB1. Thus, the FIFO buffer 121 outputs data to the baseband processor 130 according to the decreased clock frequency CLK_BB1 such that the baseband processor 130 has a decreased readout speed to read out data from the FIFO buffer 121. Note that the speed of the decreased clock frequency CLK_BB1 may be lower than that of the write speed of the ADC 112 to write in data to the FIFO buffer 121. Thus, preventing the data-empty status from occurring. Note that the above embodiment describes that the time controller 122 adjusts the integer divisor M according to the data status of the FIFO buffer 121 to further adjust the clock frequency CLK_BB1 output from the VCO 1324 to the baseband processor 130. However, in another embodiment, the baseband processor may adjust the integer divisor M of the variable integer divider 1321 according to the present data status of FIFO. Namely, the baseband processor 130 may automatically adjust the clock frequency by the clock controller 122.

Figure 3B:
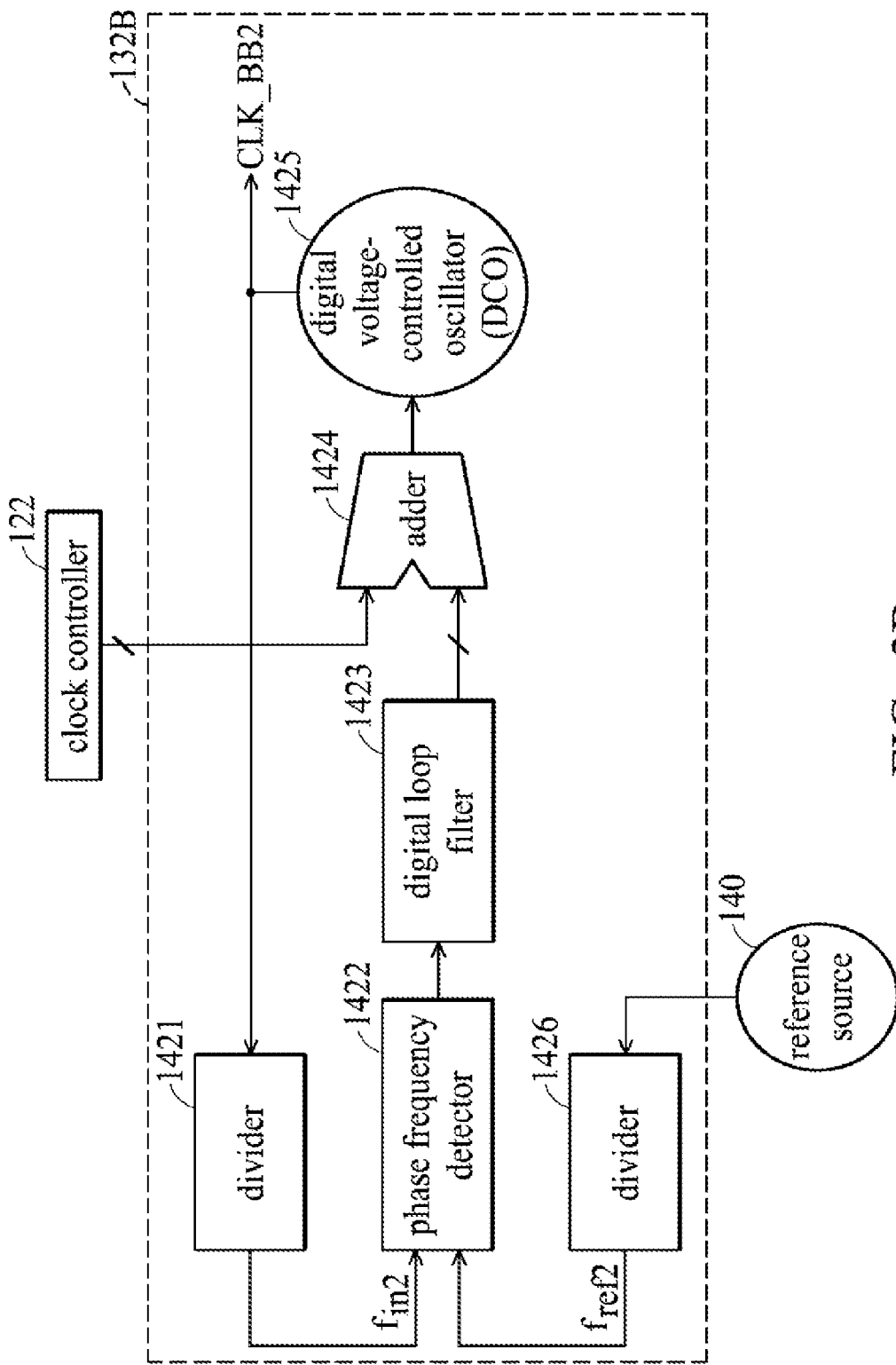
FIG. 3B is a block diagram of a second signal source according to another embodiment of the invention.

FIG. 3B is a block diagram of a second signal source according to another embodiment of the invention. The second source 132B may be a frequency synthesizer, comprising a divider 1421, a phase frequency detector (PFD) 1422, a digital loop filter 1423, an adder 1424, a digital voltage-controlled oscillator (DCO) 1425 and a divider 1426. The embodiment is the same with the second source 132A of FIG. 3A in various aspects, such as that the clock frequency CLK_BB2 is the clock of the baseband processor 130, and the FIFO buffer 121 outputs data to the baseband processor 130 according to the clock frequency CLK_BB2. Thus, the clock frequency CLK_BB2 can be adjusted when the data status of the FIFO buffer 121 is not balanced (e.g. data-overflow or data-empty status). However, the second signal source 132B of FIG. 3B is a digital signal and the second signal source 132A of FIG. 3A is an analog signal. In FIG. 3B, the divider 1421 is capable of frequency dividing, wherein the clock frequency CLK_BB2 of the baseband processor 130 is divided by a first integer divisor, and the output clock frequency is transmitted to the PFD 1422, serving as an input frequency $f_{in2}$ of the PFD 1422. In addition, the divider 1426 receives the oscillation frequency $f_{xtal}$ of the reference source 140 and divides the oscillation frequency $f_{xtal}$ by a second integer divisor to generate a reference frequency $f_{ref2}$. The oscillation frequency $f_{xtal}$ of the reference source 140 is provided by a crystal. The PFD 1422 receives and compares the input frequency $f_{in2}$ and the reference frequency $f_{ref2}$, and then outputs a result of the comparison to the digital loop filter 1423. The digital loop filter 1423 then outputs first control bits to the adder 1424. The adder 1424 also receives second control bits output from the clock controller 122, and sums up the first and second control bits to obtain a total of the first and second control bits (total control bits). The total control bits are transmitted to the DCO 1425 so that the DCO 1425 may adjust its clock frequency CLK_BB2 output to the baseband processor 130. For example, when the amount of data stored in the FIFO buffer 121 is greater than an upper-limit, the amount of data stored in the FIFO buffer 121 may reach the data-overflow status. Hence, the clock controller 122 adjusts its second control bits (e.g. providing the second control bits having greater value) to increase the clock frequency CLK_BB2. Thus, the FIFO buffer 121 outputs data to the baseband processor 130 according to the speed of the increased clock frequency CLK_BB2 such that the baseband processor 130 has an increased readout speed to read out data from the FIFO buffer 121. Note that the speed of the increased clock frequency CLK_BB2 may be higher than the write speed of the ADC 112 to write in data to the FIFO buffer 121. Thus, preventing the data-overflow status from occurring. Similarly, when the amount of data stored in the FIFO buffer 121 is less than a lower-limit, the amount of data stored in the FIFO buffer 121 may reach the data-empty status. Hence, the clock controller 122 adjusts its second control bits (e.g. provide a second control bits having less value) to decrease the clock frequency CLK_BB2. Thus, the FIFO buffer 121 outputs data to the baseband processor 130 according to the decreased clock frequency CLK_BB2 such that the baseband processor 130 has a decreased readout speed to read out data from the FIFO buffer 121. Note that the speed of the decreased clock frequency CLK_BB2 may be lower than the write speed of the ADC 112 to write in data to the FIFO buffer 121 such that the data-empty status can be solved in this way. The same as the embodiment of FIG. 3A, the second control bits of the clock controller 122 may be determined according to a current data status of the FIFO by baseband processor 130. Namely, the baseband processor 130 may automatically adjust the clock frequency by the clock controller 122. Note that the first control bits output from the digital loop filter 1423 is required for use only when the second signal source 132B is at an initial state. The first control bits output from the digital loop filter 1423 is locked to a fixed value during successive operation of the second signal source 132B. The clock controller 122 does not lock the second control bits. Instead, the clock controller 122 adjusts the second control bits according to the data status of the baseband processor 130, and further adjusts the total control bits. Thus, the DCO 1425 dynamically adjusts the clock frequency CLK_BB2 output to the baseband processor 130 according to the total control bits. In particular, when the FIFO buffer 121 approaches to the data-overflow status (e.g. the amount of data is greater than the upper-limit), the clock controller 122 outputs positive second control bits such that the adder 1424 outputs a greater total control bits to the DCO 1425, and the DCO 1425 further increases the output clock frequency CLB_BB2. On the contrary, when the FIFO buffer 121 approaches to the data-empty status (e.g. the amount of data is less than the lower-limit), the clock controller 122 outputs a negative second control bits such that the adder 1424 outputs a less total control bits to the DCO 1425, and the DCO 1425 further decreases the output clock frequency CLB_BB2. The above two embodiments describe the data-overflow data-empty status of the FIFO buffer 121. Meanwhile, the gradually increasing or decreasing status of the amount of data stored in the FIFO buffer 121 is substantially described below.

Figure 4A:
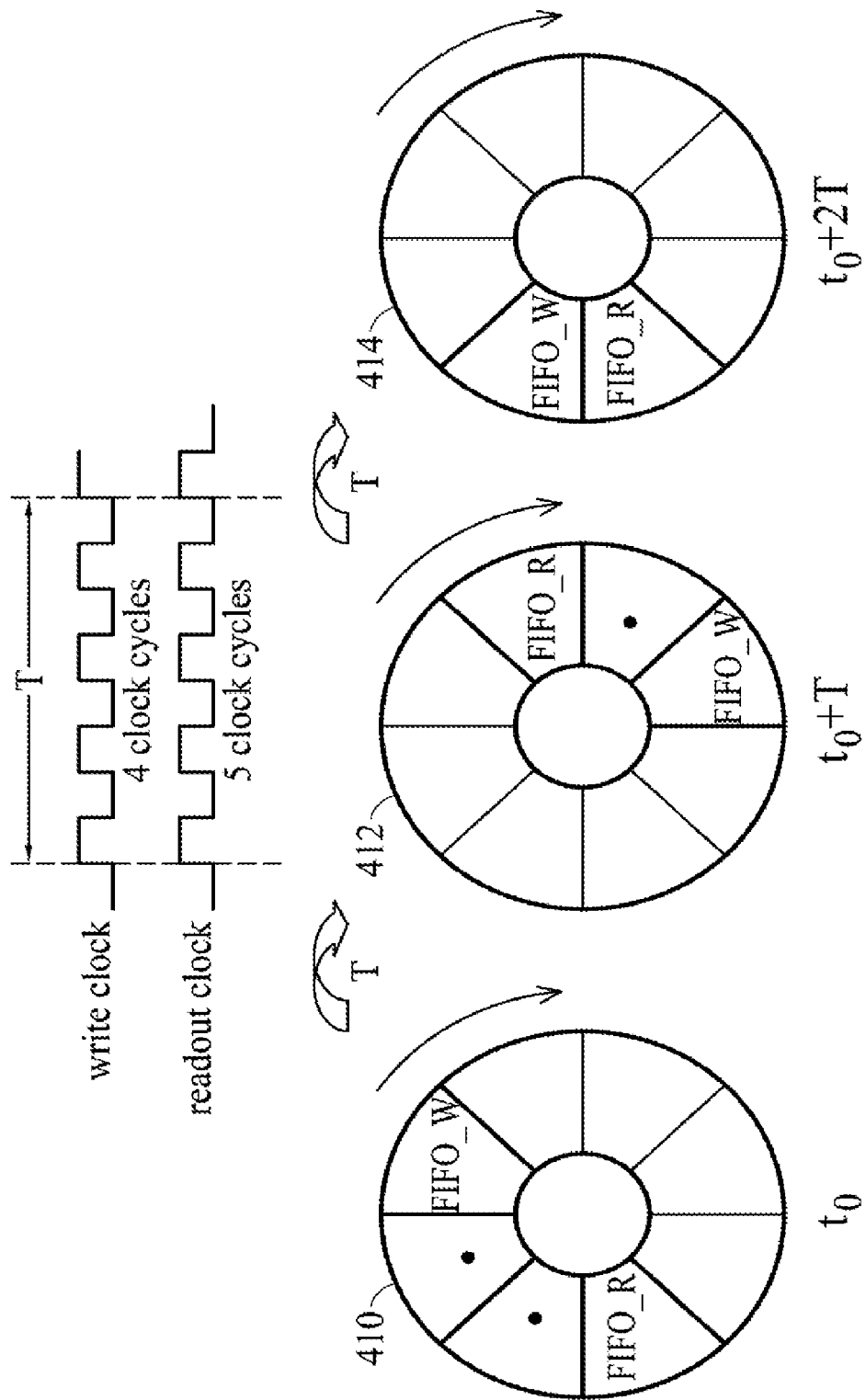
FIG. 4A shows the amount of data stored in the FIFO buffer being decreased gradually.

FIG. 4A shows the amount of data stored in the FIFO buffer being decreased gradually 121. For example, the frequency of the write clock is 4/T, and the frequency of the readout clock is 5/T. The readout speed of the FIFO buffer 121 is higher than the write speed of the FIFO buffer 121. Hence, the amount of data is gradually decreasing in each period T. Referring to FIG. 4A, regions marked by notations FIFO_R represent that the FIFO buffer 121 reads out data in the regions, and regions marked by notations FIFO_W represent that the FIFO buffer 121 writes in data in the region. Also, the black dot(s) represent(s) a status, wherein the data is stored in the FIFO buffer 121. Notation 410 represents a status, wherein the FIFO buffer 121 is at timing $t_0$, and notation 412 represents a status, wherein the FIFO buffer 121 is at timing $t_0+T$. Notation 414 represents a status, wherein the FIFO buffer 121 is at timing $t_0+2T$. When the amount of data is less than the lower-limit, the FIFO buffer 121 pulls up a data-empty signal and transmits an "error occur signal" in a next on period.

Figure 4B:
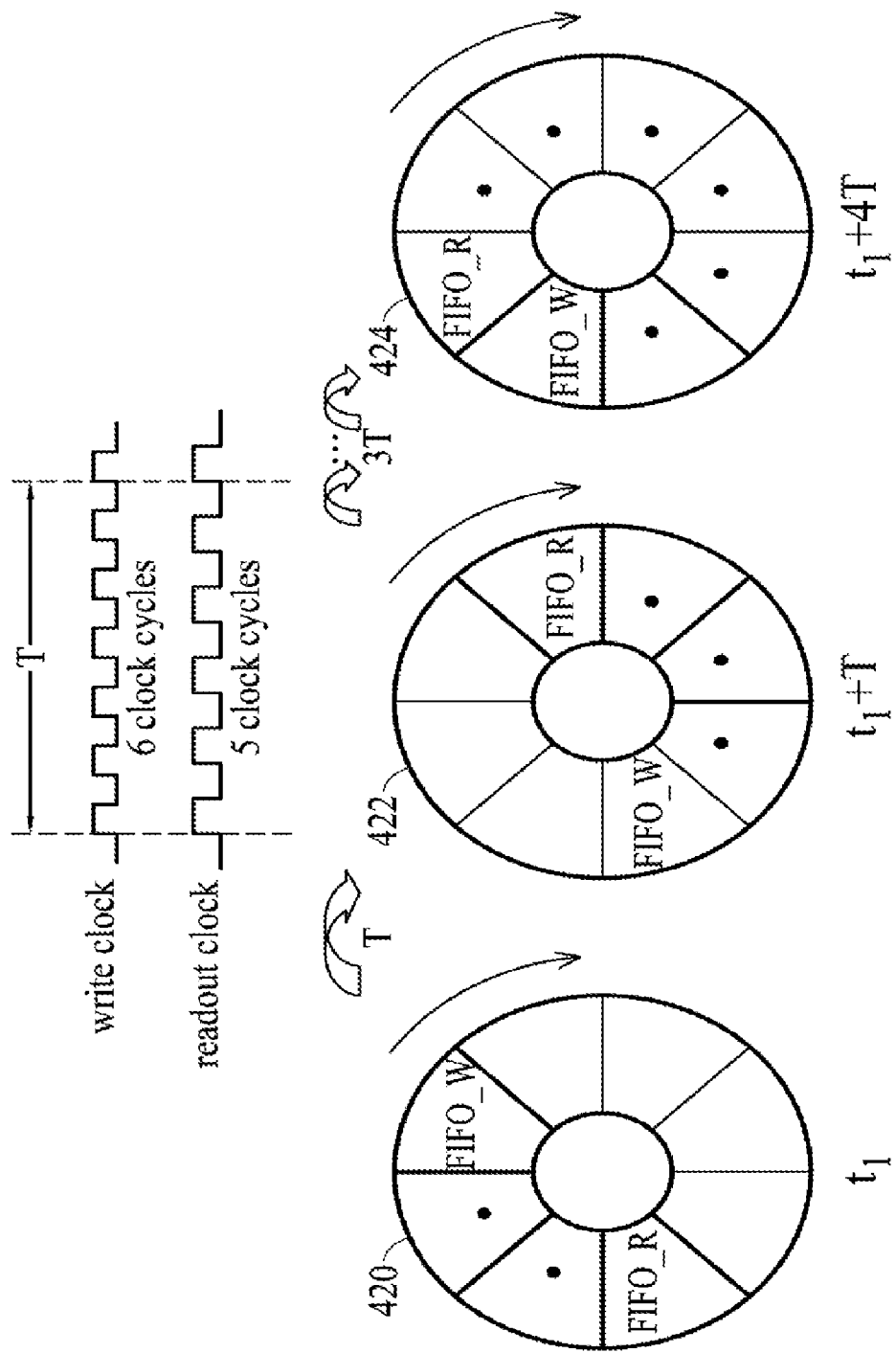
FIG. 4B shows the amount of data stored in the FIFO buffer being increased gradually.

FIG. 4B shows the amount of data stored in the FIFO buffer being increased gradually 121. For example, the frequency of the write clock is 6/T, and the frequency of the readout clock is 5/T. The write speed of the FIFO buffer 121 is higher than the readout speed of the FIFO buffer 121. Hence, the amount of data is gradually increasing in each period T. Referring to FIG. 4B, notation 420 represents a status, wherein the FIFO buffer 121 is at timing $t_1$, and notation 422 represents a status, wherein the FIFO buffer 121 is at timing $t_1+T$. Notation 424 represents a status, wherein the FIFO buffer 121 is at timing $t_1+2T$. When the amount of data is greater than the upper-limit, the FIFO buffer 121 pulls up a data-overflow signal and transmits an "error occur signal" in a next on period.

Figure 5:
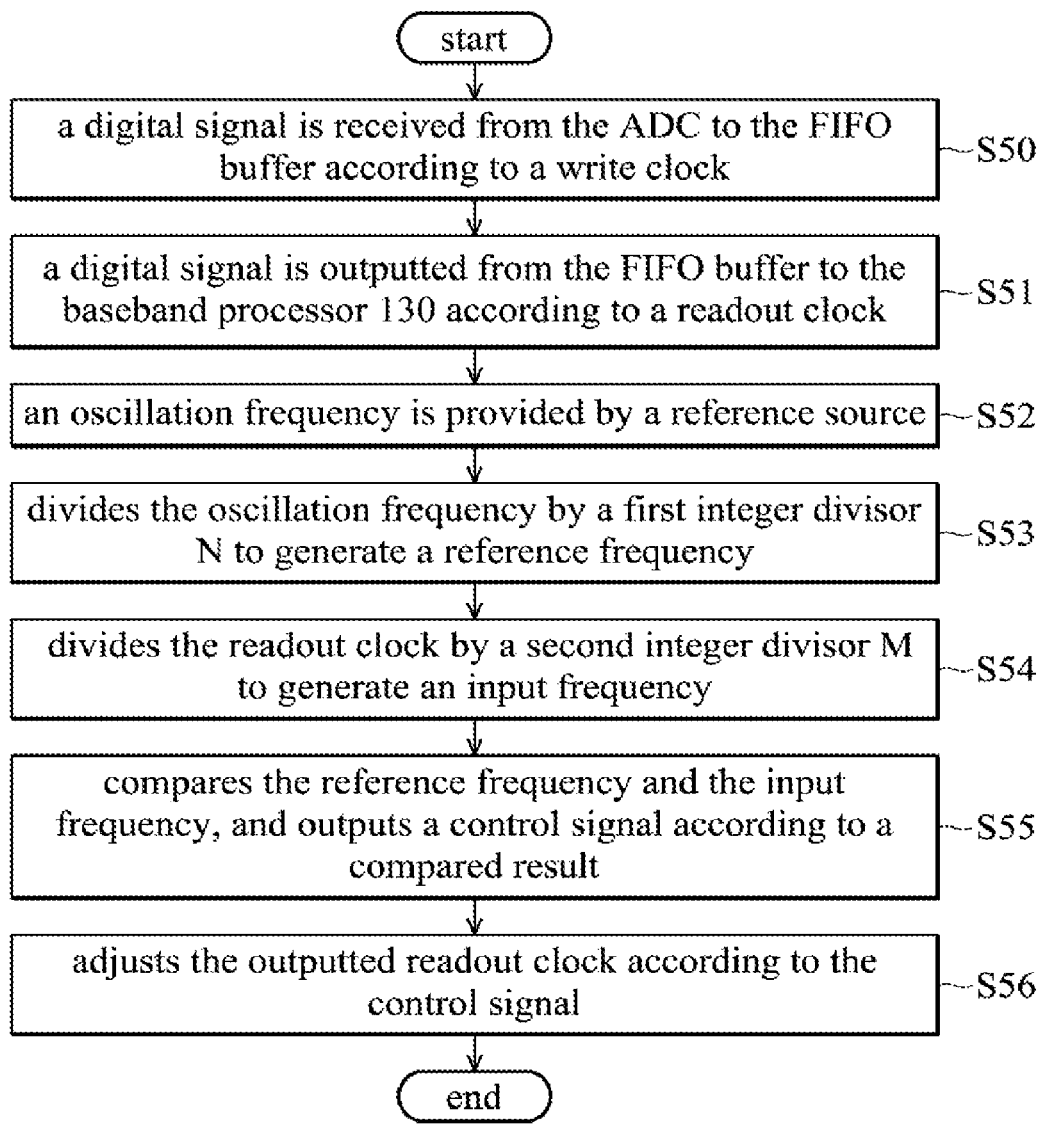
FIG. 5 is a flow chart depicting an interface operation method according to an embodiment of the invention.

As described above, when the readout clock is asynchronous with the write clock, the FIFO buffer suffers from the data-overflow or data-empty problem, which results in a data transmission error. However, the problem can be avoided by controlling the frequency of the write clock. FIG. 5 is a flow chart depicting an interface operation method according to an embodiment of the invention. By utilizing the second signal source 132A shown in FIG. 3A, the interface operation method is used to operate the FIFO interface 220 having a write clock and a readout clock of FIG. 2. First, in step S50, a digital signal is received from the ADC 112 and transmitted to the FIFO buffer 121 according to a write clock. In step S51, a digital signal is output from the FIFO buffer 121 to the baseband processor 130 according to the readout clock. In step S52, an oscillation frequency $f_{xtal}$ is provided by the reference source 140. In step S53, the divider 1324 shown in FIG. 3A divides the oscillation frequency by a first integer divisor N to generate a reference frequency $f_{ref1}$. In step S54, the variable integer divider 1321 shown in FIG. 3A divides the readout clock by a second integer divisor M to generate an input frequency $f_{in1}$. In step S55, the PFD/CP 1322 compares the reference frequency $f_{ref1}$ and the input frequency and the loop filter 1323 outputs a control signal according to a result of the comparison of the reference frequency $f_{ref1}$ and the input frequency $f_{in1}$. In step S56, the VCO 1324 shown in FIG. 3A outputs the readout clock and adjusts the readout clock that was output according to the control signal. In the flow chart of FIG. 5, the second integer divisor M is determined by the clock control signal when, for example, the readout clock is too low to cause the data-overflow status of the asynchronous interface 220. Hence, the second integer divisor M is adjusted to increase the frequency of the readout clock, and vice versa.

Figure 6:
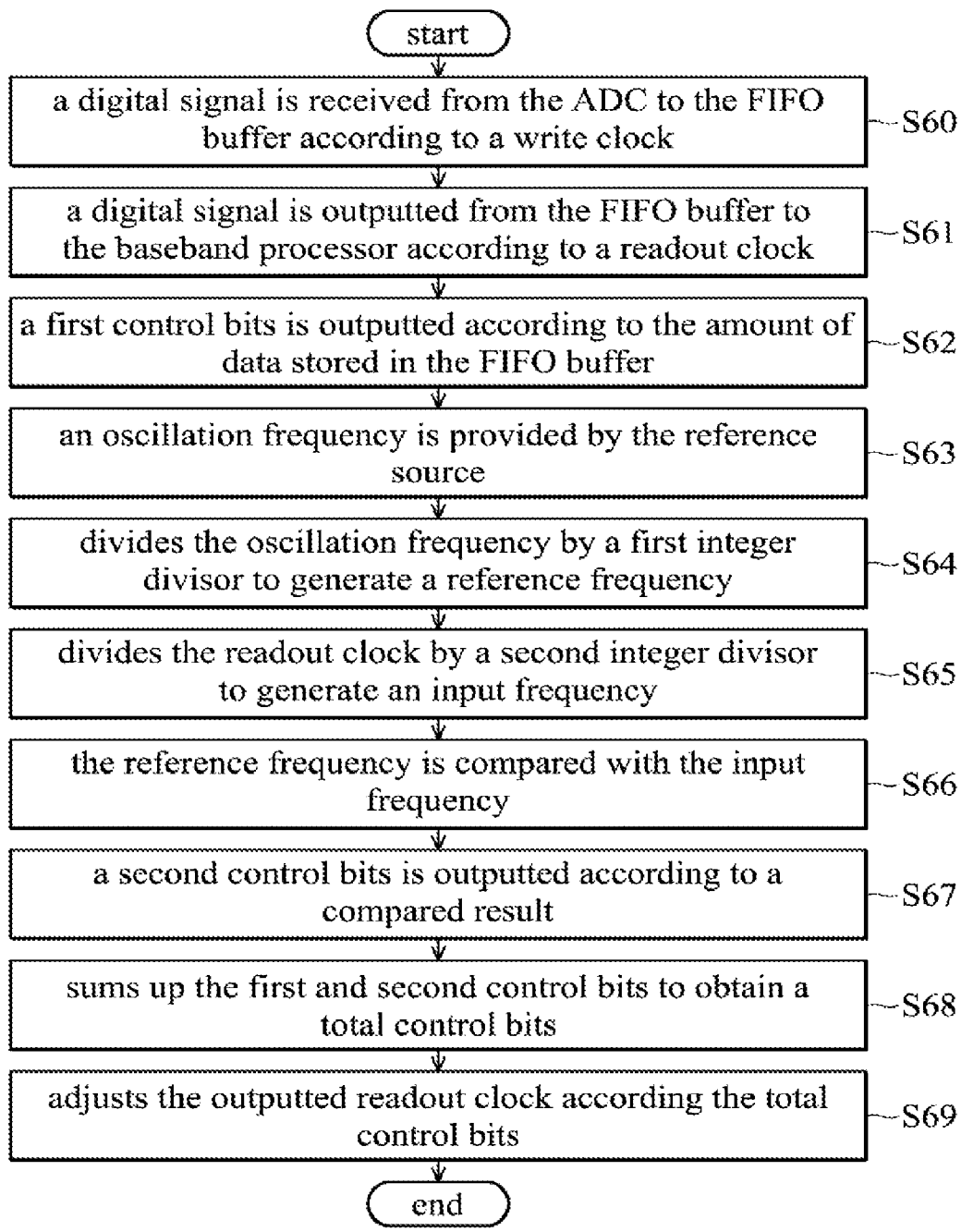
FIG. 6 is a flow chart depicting the interface operation method according to another embodiment of the invention.

FIG. 6 is a flow chart depicting the interface operation method according to another embodiment of the invention. By utilizing the second signal source 132B shown in FIG. 3B, the interface operation method is used to operate the FIFO interface 220 having a write clock and a readout clock of FIG. 2. First, in step S60, a digital signal is received from the ADC 112 and transmitted to the FIFO buffer 121 according to the write clock. In step S61, a digital signal is output from the FIFO buffer 121 to the baseband processor 130 according to the readout clock. In step S62, first control bits is outputted according to the amount of data stored in the FIFO buffer 121. In step S63, an oscillation frequency $f_{xtal}$ is provided by the reference source 140. In step S64, the divider 1426 shown in FIG. 3B divides the oscillation frequency $f_{xtal}$ by a first integer divisor to generate a reference frequency $f_{ref2}$. In step S65, the divider 1421 shown in FIG. 3B divides the readout clock by a second integer divisor to generate an input frequency $f_{in2}$. In step S66, the reference frequency $f_{ref2}$ is compared with the input frequency $f_{in2}$. In step S67, second control bits is outputted according to a result of the comparison of the reference frequency and the input frequency. In step S68, the adder 1424 shown in FIG. 3B sums up the first and second control bits to obtain a total of the first and second control bits (total control bits). In step S69, the DCO 1425 adjusts the readout clock that was output according the total control bits. In particular, when the FIFO buffer 121 approaches to the data-empty status, the first control bits output in step S62 may be negative so that the total amount of first and second control bits after summation may become smaller to decrease the outputted readout clock. On the contrary, when the FIFO buffer 121 approaches to the data-overflow status, the first control bits output in step S62 may be positive so that the total control bits after summation becomes greater to decrease the outputted readout clock.

Note that in an embodiment of the invention, the clock controller 122 performs corresponding adjustments according to the amount of data stored in the FIFO buffer 121. However, in another embodiment of the invention, the clock controller 122 may perform corresponding adjustments according to the baseband processor 130. Namely, the clock controller may increase or decrease the clock frequency according to the present data status of the FIFO by baseband processor 130.

Figure 7:
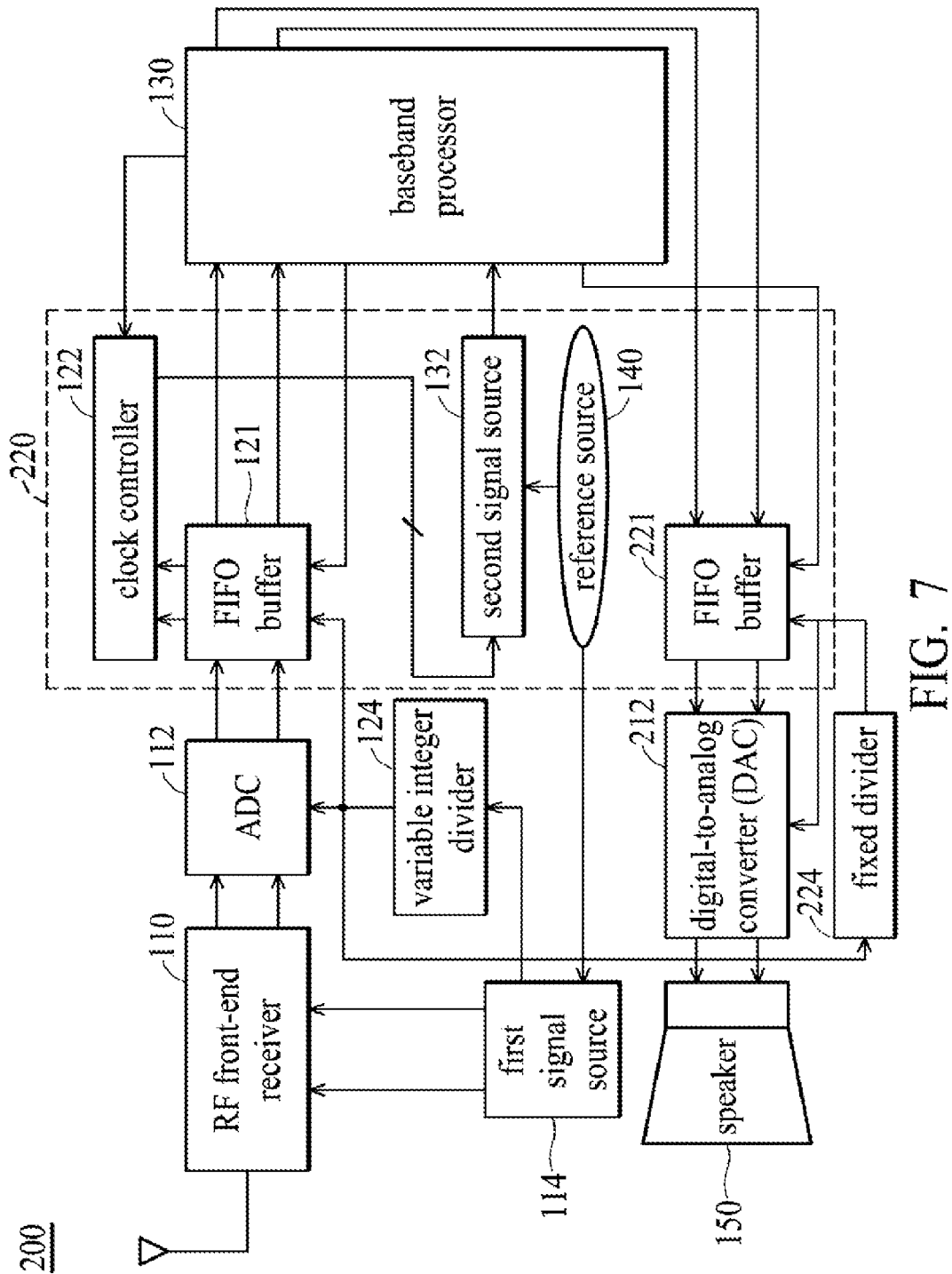
FIG. 7 is a block diagram of a receiver for practical use according an embodiment of the invention.

FIG. 7 is a block diagram of a receiver 200 for practical use according an embodiment of the invention. In FIG. 7, a receiver 200 further comprises a back-end speaker 150 of a digital-to-analog converter (DAC) 212 except for the RF front-end receiver 110. The asynchronous FIFI interface 220 further comprises a FIFO buffer 221 at output terminal. The same with the FIFO buffer shown in FIG. 2, the FIFO buffer 221 receives data according to the clock of the baseband processor 130, and outputs data to the DAC 212 according to the divided clock frequency generated from the divider. The DAC 212 then transmits the corresponding audio data to the speaker 150.

Figure 8A:
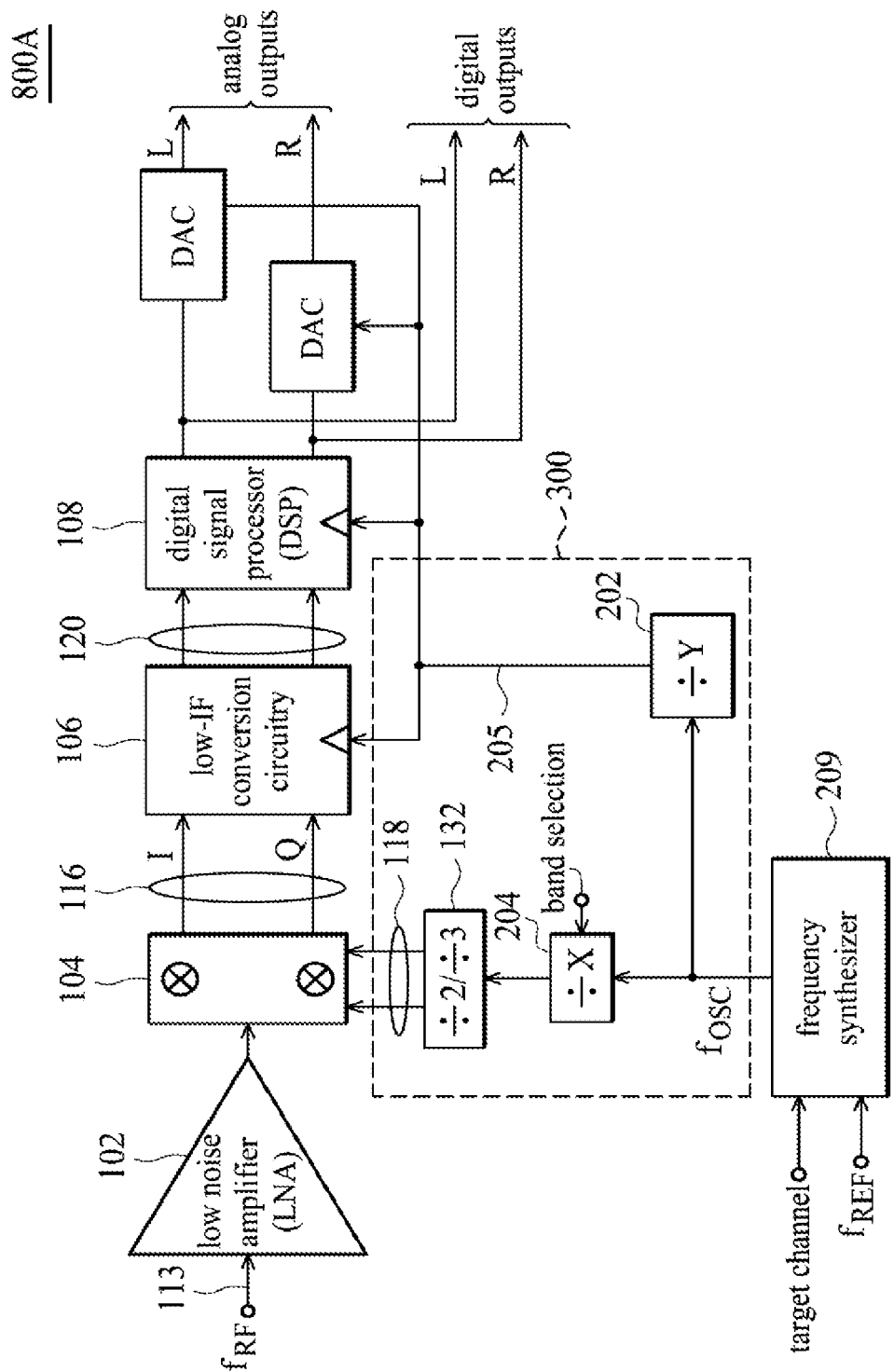
FIG. 8A is a block diagram of the integrated receiver according to an embodiment of the invention.
Figure 8B:
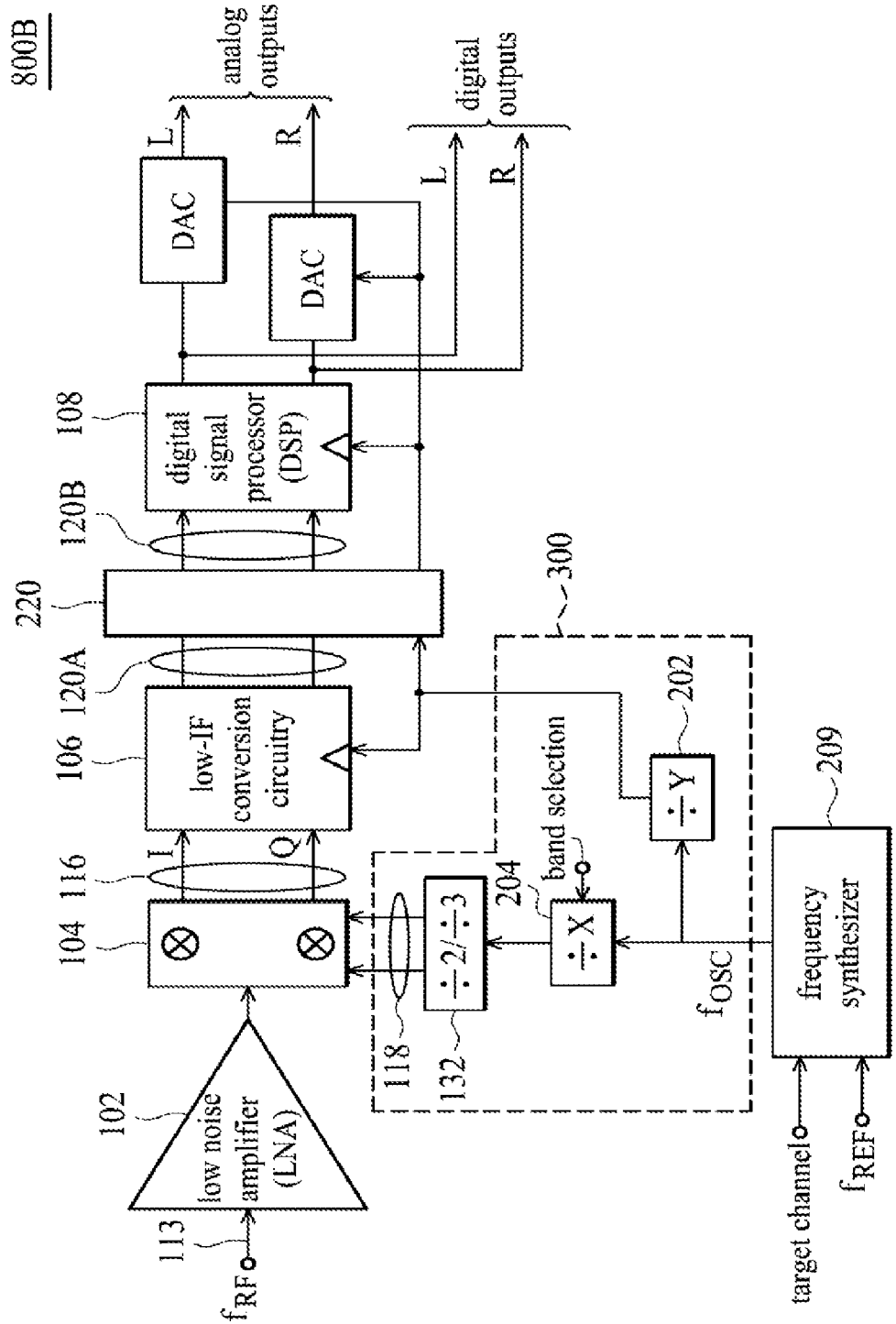
FIG. 8B is an embodiment of utilizing the synchronous FIFO interface according to the invention.

In addition, the invention can be implemented in an integrated receiver. FIG. 8A is a block diagram of the integrated receiver 800A according to an embodiment of the invention, wherein a low noise amplifier (LNA) 102 is applied to an analog receiving path circuitry. The LNA 102 outputs signal to a mixer 104 according to the received RF signal 113. The mixer 104 generates a low intermediate-frequency (low-IF) signal 116 to a low-IF conversion circuitry 106. The low-IF conversion circuitry 106 digitalizes the received low-IF signal 116 according to a digital sampling-clock signal 205, and outputs a digital signal 120 to a digital signal processor (DSP) 108. The DSP 108 processes the digital signal 120 according to a digital clock signal (i.e. the digital sampling-clock signal 205). Note that the DSP 108 processes the digital signal, however, not according to the digital sampling-clock signal 205, as shown in FIG. 8B. In FIG. 8A, a clock system 300 is used to generate a mixed signal 108, the digital sampling-clock signal 205 belongs to the low-IF conversion circuitry 106 and the digital clock signal 205 belongs to the DSP 108. The clock system 300 comprises a plurality of dividers 132, 202 and 204. The clock system 300 receives a frequency $f_{OSC}$ generated from a frequency synthesizer 209, and utilizes the dividers 132, 202 and 204 to generate the mixed signal 118, the digital sampling-clock signal 205 and the digital clock signal 205. The asynchronous FIFO buffer 220 may be used between the low-IF conversion circuitry 106 and the DSP 108, as shown in FIG. 8B.

FIG. 8B is an embodiment of utilizing the synchronous FIFO interface 220 according to the invention. The FIFO buffer 121 of the synchronous FIFO interface 220 receives a digital signal 120A from the low-IF conversion circuitry 106 according to the write clock and outputs a digital signal 120B to the DSP 108 according to the readout clock. The FIFO buffer 121 also performs data buffering of the write and readout operation between the low-IF conversion circuitry 106 and the DSP 108. The operation method is the same with the content described above, and detailed description is not provided for brevity.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An asynchronous first in first out (FIFO) interface having a readout clock asynchronous with a write clock, comprising:
    a buffer for receiving a digital signal from an analog-to-digital converter (ADC) according to the write clock and outputting the digital signal to a processor according to the readout clock;
    a clock controller for outputting a clock control signal according to an amount of data stored in the buffer;
    a reference source for providing a reference clock with an oscillation frequency; and
    a signal source for dividing the frequency of the reference clock with the oscillation frequency by a first integer divisor to generate a frequency-divided reference clock with a reference frequency, dividing the frequency of the readout clock by a second integer divisor to generate a frequency-divided readout clock with an input frequency, and outputting a control signal by comparing the reference frequency with the input frequency to adjust the readout clock, wherein the second integer divisor is determined by the clock control signal.

2. The asynchronous FIFO interface of claim 1, wherein the processor is a baseband processor.

3. The asynchronous FIFO interface of claim 1, wherein the reference clock with the oscillation frequency is provided by a crystal oscillator.

4. The asynchronous FIFO interface of claim 1, wherein the signal source comprises:
   a divider for dividing the frequency of the reference clock with the oscillation frequency by the first integer divisor to generate the frequency-divided reference clock with the reference frequency;
   a variable integer divider for dividing the frequency of the readout clock by the second integer divisor to generate the frequency-divided readout clock with the input frequency;
   a phase frequency detector/charge pump (PFD/CP) for comparing the reference frequency with the input frequency;
   a loop filter for outputting the control signal according to a result of the comparison of the reference frequency and input frequency; and
   a voltage controlled oscillator (VCO) for outputting and adjusting the readout clock according to the control signal.

5. The asynchronous FIFO interface of claim 1, wherein the clock controller adjusts the second integer divisor for adjusting the amount of data stored in the buffer when the amount of data stored in the buffer is greater than an upper threshold or less than a lower threshold.

6. The asynchronous FIFO interface of claim 1, wherein the upper threshold represents a data-overflow signal and the lower threshold represents a data-empty signal.

7. The asynchronous FIFO interface of claim 1, wherein the clock controller adjusts the second integer divisor such that the write clock is slower than the readout clock, when the amount of data stored in the buffer is greater than an upper threshold.

8. The asynchronous FIFO interface of claim 1, wherein the clock controller adjusts the second integer divisor such that the write clock is faster than the readout clock when the amount of data stored in the buffer is less than a lower threshold.

9. The asynchronous FIFO interface of claim 1, wherein the second integer divisor is determined by the processor.

10. An interface operation method for operating an asynchronous interface having a readout clock and a write clock, wherein the asynchronous interface comprises a buffer, comprising:
    receiving a digital signal from an analog-to-digital converter (ADC) according to the write clock;
    outputting the digital signal from the buffer to a processor according to the readout clock;
    outputting a clock control signal according to the amount of data stored in the buffer;
    providing a reference clock with an oscillation frequency;
    frequency-dividing the reference clock with the oscillation frequency by a first integer divisor to generate a frequency-divided reference clock with? a reference frequency;
    dividing the readout clock by a second integer divisor to generate a frequency-divided readout clock with an input frequency; and
    adjusting the readout clock by comparing the reference frequency with the input frequency, wherein the second integer divisor is determined by the clock control signal.

11. The interface operation method of claim 10, wherein the processor is a baseband processor.

12. The interface operation method of claim 10, wherein the reference clock with the oscillation frequency is provided by a crystal oscillator.

13. The interface operation method of claim 10, wherein the interface operation method further comprises:
    changing the second integer divisor for adjusting the amount of data stored in the buffer when the amount of data stored in the buffer is greater than an upper threshold or less than a lower threshold.

14. The interface operation method of claim 13, wherein the upper threshold represents a data-overflow signal and the lower threshold represents a data-empty signal.

15. The interface operation method of claim 10, further comprising adjusting the second integer divisor such that the write clock is slower than the readout clock when the amount of data stored in the buffer is greater than an upper threshold.

16. The interface operation method of claim 10, further comprising adjusting the second integer divisor such that the write clock is faster than the readout clock when the amount of data stored in the buffer is less than a lower threshold.

17. The interface operation method of claim 10, wherein the second integer divisor is determined by the processor.

18. An asynchronous first in first out (FIFO) interface having a readout clock asynchronous with an asynchronous write clock, comprising:
    a buffer for receiving a digital signal from an analog-to-digital converter (ADC) according to a write clock and outputting the digital signal to a processor according to a readout clock;
    a clock controller for outputting first control bits according to an amount of data stored in the buffer;
    a reference source for providing a reference clock with an oscillation frequency; and
    a signal source for dividing the oscillation frequency by a first integer divisor to generate a frequency-divided reference clock with a reference frequency, dividing the frequency of the readout clock by a second integer divisor to generate a frequency-divided readout clock with an input frequency, outputting second control bits by comparing the reference frequency with the input frequency, summing up the first control bits and the second control bits to obtain a total of the first and second control bits (total control bits), and adjusting the readout clock according to the total control bits.

19. The asynchronous FIFO interface of claim 18, wherein the processor is a baseband processor.

20. The asynchronous FIFO interface of claim 18, wherein the reference clock with the oscillation frequency is provided by a crystal oscillator.

21. The asynchronous FIFO interface of claim 18, wherein the signal source comprises:
    a first divider for dividing the frequency of the reference clock with the oscillation frequency by the first integer divisor to generate the frequency-divided reference clock with the reference frequency;
    a second divider for dividing the frequency of the readout clock by the second integer divisor to generate the frequency-divided readout clock with the input frequency;
    a phase frequency detector (PFD) for comparing the reference frequency with the input frequency;
    a digital loop filter for outputting the second control bits according to a result of the comparison of the reference frequency and input frequency;

an adder for summing up the first control bits and the second control bits to obtain a total of the first and second control bits (total control bits); and
a voltage controlled oscillator (VCO) for outputting and adjusting the readout clock according to the total control bits.

22. The asynchronous FIFO interface of claim 18, wherein the clock controller adjusts the value of the first control bits for adjusting the amount of data stored in the buffer when the amount of data stored in the buffer is greater than an upper threshold or less than a lower threshold.

23. The asynchronous FIFO interface of claim 22, wherein the upper threshold represents a data-overflow signal and the lower threshold represents a data-empty signal.

24. The asynchronous FIFO interface of claim 18, wherein the clock controller adjusts the value of the first control bits such that the write clock is slower than the readout clock when the amount of data stored in the buffer is greater than an upper threshold.

25. The asynchronous FIFO interface of claim 18, wherein the clock controller adjusts the value of the first control bits such that the write clock is faster than the readout clock when the amount of data stored in the buffer is less than a lower threshold.

26. The asynchronous FIFO interface of claim 18, wherein the value of the first control bits is determined by the processor.

27. An interface operation method for operating an asynchronous interface having a readout clock and a write clock, wherein the asynchronous interface comprises a buffer, the interface operation method comprising:
receiving a digital signal from an analog-to-digital converter (ADC) according to the write clock;
outputting the digital signal from the buffer to a processor according to the readout clock;
outputting first control bits according to the amount of data stored in the buffer;
providing a reference clock with an oscillation frequency;
frequency-dividing the reference clock with the oscillation frequency by a first integer divisor to generate a frequency-divided reference clock with a reference frequency;
dividing the readout clock by a second integer divisor to generate a frequency-divided readout clock with an input frequency;
outputting second control bits by comparing the reference frequency with the input frequency;
summing up the first control bits and the second control bits to obtain a total of the first and second control bits (total control bits); and
adjusting the readout clock that was output according to the total control bits.

28. The interface operation method of claim 27, wherein the processor is a baseband processor.

29. The interface operation method of claim 27, wherein the reference clock with the oscillation frequency is provided by a crystal oscillator.

30. The interface operation method of claim 27, further comprising:
adjusting the value of the first control bits for adjusting the amount of data stored in the buffer when the amount of data stored in the buffer is greater than an upper threshold or less than a lower-limit.

31. The interface operation method of claim 30, wherein the upper threshold represents a data-overflow signal and the lower threshold represents a data-empty signal.

32. The interface operation method of claim 27, further comprising:
adjusting the value of the first control bits such that the write clock is lower than the readout clock when the amount of data stored in the buffer is greater than an upper threshold.

33. The interface operation method of claim 27, further comprising:
adjusting the value of the first control bits such that the write clock is higher than the readout clock when the amount of data stored in the buffer is less than a lower threshold.

34. The interface operation method of claim 27, wherein the value of the first control bits is determined by the processor.

35. An integrated receiver, comprising:
a frequency synthesizer for generating an output signal;
a clock system for generating a mixed signal and a write clock according to the output signal;
an analog receiving path circuitry for generating a low-IF signal according to the mixed signal;
a low-IF conversion circuitry for converting the low-IF signal to a first digital signal according to the write clock;
a processor for processing a second digital signal according to a readout signal; and
an asynchronous first in first out (FIFO) interface coupled between the analog receiving path circuitry and the processor, and having the readout clock asynchronous with the asynchronous write clock, wherein the asynchronous FIFO interface comprises:
a buffer for receiving the first digital signal from the low-IF conversion circuitry according to the write clock and outputting the second digital signal to the processor according to the readout clock;
a clock controller for outputting a clock control signal according to the amount of data stored in the buffer;
a reference source for providing an oscillation frequency; and
a signal source for dividing the oscillation frequency by a first integer divisor to generate a reference frequency, dividing the readout clock by a second integer divisor to generate an input frequency, and outputting a control signal by comparing the reference frequency with the input frequency to adjust the readout clock that was output, wherein the second divisor is determined by the clock control signal.

36. The integrated receiver of claim 35, wherein the processor is a digital signal processor (DSP).

37. The integrated receiver of claim 35, wherein the oscillation frequency is provided by a crystal.

38. The integrated receiver of claim 35, wherein the signal source comprises:
a divider for dividing the oscillation frequency by the first integer divisor to generate the reference frequency;
a variable integer divider for dividing the readout clock by the second integer divisor to generate the input frequency;
a phase frequency detector/charge pump (PFD/CP) for comparing the reference frequency with the input frequency;
a loop filter for outputting the control signal according to a compared result of the reference frequency and input frequency; and
a voltage-control oscillator (VCO) for outputting the readout clock and adjusting the readout clock that was output according to the control signal.

39. The integrated receiver of claim 35, wherein the clock controller adjusts the second integer divisor for adjusting the amount of data stored in the buffer when the amount of data stored in the buffer is greater than an upper-limit or less than a lower-limit.

40. The integrated receiver of claim 39, wherein the upper limit represents a data-overflow signal and the lower limit represents a data-empty signal.

41. The integrated receiver of claim 35, wherein the clock controller adjusts the second integer divisor such that the write clock is lower than the readout clock when the amount of data stored in the buffer is greater than an upper-limit.

42. The integrated receiver of claim 35, wherein the clock controller adjusts the second integer divisor such that the write clock is higher than the readout clock when the amount of data stored in the buffer is less than a lower-limit.

43. The integrated receiver of claim 35, wherein the second integer divisor is determined by the processor.

44. An integrated receiver, comprising:
a frequency synthesizer for generating an output signal;
a clock system for generating a mixed signal and a write clock according to the output signal;
an analog receiving path circuitry for generating a low-IF signal according to the mixed signal;
a low-IF conversion circuitry for converting the low-IF signal to a first digital signal according to the write clock;
a processor for processing a second digital signal according to a readout signal; and
an asynchronous first in first out (FIFO) interface coupled between the analog receiving path circuitry and the processor, and having the readout clock asynchronous with the asynchronous write clock, wherein the asynchronous FIFO interface comprises:
a buffer for receiving a digital signal from an analog-to-digital converter (ADC) according to the write clock and outputting a digital signal to a processor according to the readout clock;
a clock controller for outputting first control bits according to the amount of data stored in the buffer;
a reference source for providing an oscillation frequency; and
a signal source for dividing the oscillation frequency by a first integer divisor to generate a reference frequency, dividing the readout clock by a second integer divisor to generate an input frequency, outputting second control bits by comparing the reference frequency with the input frequency, and summing up the first control bits and the second control bits to obtain a total of the first and second control bits (total control bits), and adjusting the readout clock according to the total control bits.

45. The integrated receiver of claim 44, wherein the signal source comprises:
a first divider for dividing the oscillation frequency by the first integer divisor to generate the reference frequency;
a second divider for dividing the readout clock by the second integer divisor to generate the input frequency;
a phase frequency detector (PFD) for comparing the reference frequency with the input frequency;
a digital loop filter for outputting the second control bits according to a compared result of the reference frequency and input frequency;
an adder for summing up the first control bits and the second control bits to obtain a total of the first and second control bits (total control bits); and
a voltage-control oscillator (VCO) for outputting the readout clock and adjusting the readout clock that was output according to the total control bits.

* * * * *